United States Patent [19]

Kobatake

[11] Patent Number: 4,788,460

[45] Date of Patent: Nov. 29, 1988

[54] CIRCUIT ARRANGEMENT OF SENSE AMPLIFIER FOR RAPID EVALUATION OF LOGIC STATE

[75] Inventor: Hiroyuki Kobatake, Tokyo, Japan

[73] Assignee: NEC Corporation, Tokyo, Japan

[21] Appl. No.: 29,833

[22] Filed: Mar. 24, 1987

[30] Foreign Application Priority Data

Mar. 24, 1986 [JP] Japan .................................. 61-66507

[51] Int. Cl.$^4$ ........................................ H03K 19/094
[52] U.S. Cl. .................................... 307/530; 307/359;
 307/448; 307/584
[58] Field of Search .............. 307/443, 448, 451, 350, 307/530, 359, 575–577, 573, 579, 584–585; 365/184–185, 189, 206

[56] References Cited

U.S. PATENT DOCUMENTS

| | | | |
|---|---|---|---|
| 4,388,541 | 6/1983 | Giebel | 307/448 X |
| 4,479,067 | 10/1984 | Fujita | 307/448 X |
| 4,535,259 | 8/1985 | Smarandoiu et al. | 307/530 |
| 4,577,124 | 3/1986 | Koike | 307/448 X |
| 4,634,890 | 1/1987 | Lee | 307/443 X |

Primary Examiner—Stanley D. Miller
Assistant Examiner—D. R. Hudspeth
Attorney, Agent, or Firm—Sughrue, Mion, Zinn, Macpeak, and Seas

[57] ABSTRACT

For improvement of operation speed, a sense amplifier circuit comprising (a) a signal input node, (b) a signal output node, (c) load means with a relatively large resistance provided between a source of voltage and the signal output node, (d) a first field effect transistor with a relatively small channel resistance provided between the signal input node and the signal output node and having a gate electrode, (e) a logic gate having at least one input node connected to the signal input node and an output node connected to the gate electrode of the first field effect transistor, and (f) a second field effect transistor with a relatively small channel resistance provided between the source of voltage and the signal output node and having a gate electrode connected to the output node of the logic gate.

7 Claims, 5 Drawing Sheets

CIRCUIT ARRANGEMENT OF SENSE AMPLIFIER FOR RAPID EVALUATION OF LOGIC STATE

FIELD OF THE INVENTION

This invention relates to a sense amplifier circuit and, more particularly, to a sense amplifier circuit incorporated in a semiconductor memory device.

BACKGROUND OF THE INVENTION

A sense amplifier circuit is typically used in a semiconductor memory device for reading out a bit of information stored in an accessed memory cell. When a CPU operates in association with the semiconductor memory devices, there is usually seen a difference between the CPU cycle time and the memory cycle time. That is, the CPU operates faster than the memory devices. One of approaches to reduce the difference between the two cycle times is to increase the operation speed of the sense amplifier circuit incorporated in each of the memory devices.

It is therefore an important object of the present invention to provide an improved sense amplifier circuit which operates at an increased speed.

It is another important object of the present invention to provide a semiconductor memory device operative in an improved memory cycle time.

SUMMARY OF THE INVENTION

In accordance with one outstanding aspect of the present invention, there is provided a sense amplifier circuit comprising (a) a signal input node, (b) a signal output node, (c) load means with a relatively large resistance provided between a source of voltage and the signal output node, (d) a first field effect transistor with a relatively small channel resistance provided between the signal input node and the signal output node and having a gate electrode, (e) a logic gate having at least one input node connected to the signal input node and an output node connected to the gate electrode of the first field effect transistor, and (f) a second field effect transistor with a relatively small channel resistance provided between the source of voltage and the signal output node and having a gate electrode connected to the output node of the logic gate.

In accordance with another outstanding aspect of the present invention, there is provided a sense amplifier circuit for use in a semiconductor memory device including a memory cell array having a plurality of memory cells arranged in rows and columns, a row selector selecting a row of memory cells, a column selector selecting a column of memory cells and having an output node to which a high voltage level or a low voltage level appears depending upon a piece of information stored in one of the memory cells specified by both of the row and column selectors, a reference voltage producing circuit, and a comparator having two input nodes one of which is connected to the reference voltage producing circuit, comprising (a) an signal input node connected to the output node of the column selector; (b) an signal output node connected to the other of the input nodes of the comparator, (c) a series combination of n-channel shallow depletion-type field effect transistors provided between a source of positive voltage and the signal output node, the n-channel shallow depletion-type field effect transistors having respective gate electrodes connected to the source of positive voltage so as to provide a relatively large resistance, (d) a first n-channel enhancement-type field effect transistor with a relatively small channel resistance provided between the signal output node and the signal input node and having a gate electrode, (e) a second n-channel enhancement-type field effect transistor with a relatively small channel resistance provided between the positive voltage source and the signal output node and having a gate electrode, the second n-channel enhancement-type field effect transistor having a threshold voltage approximately equal to that of said first n-channel enhancement-type field effect transistor, and (f) a NOR gate having an output node connected to both of the gate electrodes of the first and second n-channel enhancement-type field effect transistors and two input nodes one of which is connected to the signal input node and the other of which is capable of being supplied with an activating signal.

BRIEF DESCRIPTION OF THE DRAWINGS

The problems of prior-art sense amplifier circuits and the features and advantages of a sense amplifier circuit according to the present invention will be more clearly understood from the following description taken in conjunction with the accompanying drawings in which.

DESCRIPTION OF THE PRIOR ART

Figure 1:
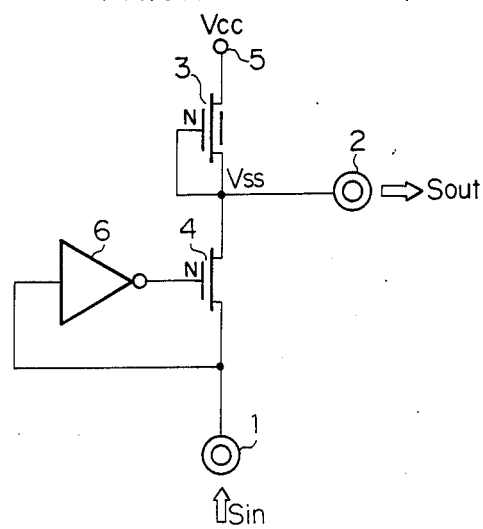
FIG. 1 is a circuit diagram showing the circuit arrangement of a prior art sense amplifier circuit.

Referring to FIG. 1 of the drawings, there is shown a known sense amplifier circuit which comprises a signal input node 1, a signal output node 2, a series combination of an n-channel depletion-type MOS transistor 3 and an n-channel enhancement-type MOS field effect transistor 4 provided between a source of positive voltage 5 capable of supplying a positive voltage level Vcc and the signal output node 2, and an inverter circuit 6 having an input node connected to the signal input node 1 and an output node connected to a gate electrode of the MOS field effect transistor 4. The MOS field effect transistor 3 has a gate electrode and a source node connected to each other and, for this reason, serves as a load transistor. The MOS field effect transistor 3 is arranged to have a sufficiently large channel resistance with respect to the MOS field effect transistor 4.

Though not shown in the drawings, the signal input node 1 is capable of being electrically connected to an output node of an EPROM (erasable programmable read only memory) cell through a selector unit (not shown) and is grounded when the EPROM cell stores a bit of information of "0". On the other hand, when the EPROM cell stores a bit of information of "1", the signal input node 1 is blocked from ground. For this reason, an input signal Sin of a high or low voltage level appears at the signal input node 1 depending upon the bit of information stored in the memory cell.

In operation, when the input signal Sin of the low voltage level appears at the signal input node 1, the inverter circuit 6 produces an output signal of a high voltage level which is applied to the gate electrode of the MOS field effect transistor 4. Then, the MOS field effect transistor 4 turns on and provides a current path between the signal output node 2 and the signal input node 1. With the current path produced in the MOS field effect transistor 4, a current flows from the signal output node 2 through the MOS field effect transistor 4, the signal input node 1 and the selected EPROM cell to the ground, so that the signal output node 2 has an output signal Sout of a voltage level sufficiently lower than the positive voltage level Vcc.

On the other hand, when the input signal Sin of the high voltage level appears at the signal input node 1, the inverter circuit 6 changes the output signal thereof from the high voltage level to a low voltage level which causes the MOS field effect transistor 4 to turn off, thereby blocking the current path between the signal output node 2 and the signal input node 1. This gives rise to an increase in the voltage level at the signal output node 2, then the output signal Sout has a high voltage level close to the positive voltage level Vcc. Thus, the output signal Sout at the signal output node 2 swings its voltage level between the two voltage level depending upon the voltage level of the input signal Sin.

However, a problem has been encountered in the prior art sense amplifier circuit illustrated in FIG. 1 in that a substantial time delay takes place when the output signal Sout at the signal output node 2 goes up from the low voltage level to the high voltage level. This is because of the fact that the signal output node 2 is supplied with current only through the n-channel depletion-type MOS field effect transistor 3 which provides the large channel resistance.

Figure 2:
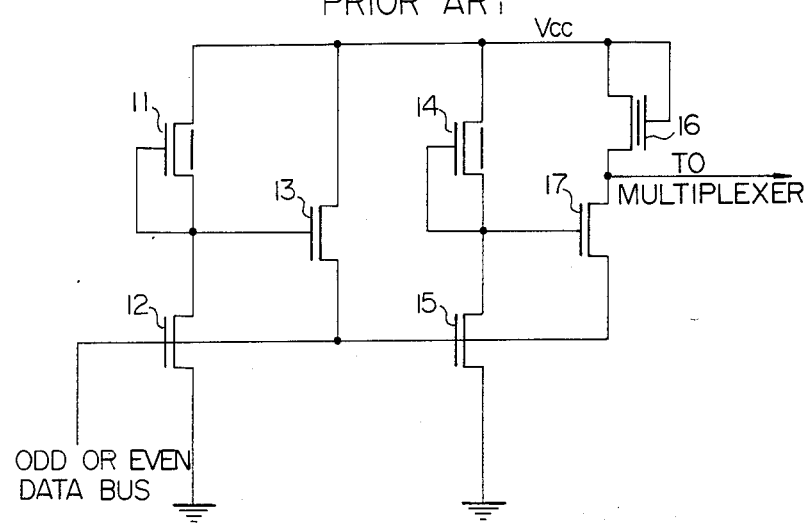
FIG. 2 is a circuit diagram showing the circuit arrangement of another prior art sense amplifier circuit.

Attempts have been made to reduce the aforementioned time delay. One of the solutions is disclosed by Vernon G. McKenny in "Good bits swapped for bad in 64-kilobit E-PROM", Electronics / Mar. 13, 1980, pages 115 to 121. The sense amplifier circuit disclosed in the above mentioned paper is illustrated in FIG. 2, in which an inverter circuit consisting of a depletion-type MOS field effect transistor 11 and an enhancement-type MOS field effect transistor 12 is combined with an enhancement type MOS field effect transistor 13 provided between a source of voltage Vcc and a data bus to form a charge-up circuit. The sense amplifier circuit illustrated in FIG. 2 further comprises a feedback inverter circuit consisting of a depletion-type MOS field effect transistor 14 and an enhancement MOS field effect transistor 15, which controls an output inverter circuit consisting of a floating-gate device 16 and an enhancement-type MOS field effect transistor 17.

In order to make the charge-up circuit display its ability, it is necessary to select the threshold voltage of the inverter circuit of the charge-up circuit close to the threshold voltage of the feedback inverter circuit. However, if the difference between the two threshold voltages is too small, the MOS field effect transistor 13 is late in cutting off the current path between the source of voltage Vcc and the data bus, and, then, the data bus is charged up over the threshold voltage of the feedback inverter circuit. This prevents the sense amplifier circuit from a high speed operation.

On the other hand, if the difference between the two threshold voltages is too large, the effect of the charge-up circuit is limited, and it is also impossible to expect the sense amplifier circuit to operate at a sufficiently high speed. For this reason, a designer needs to precisely adjust the difference between the two threshold voltages, and, accordingly, the manufacturer is expected to concentrate his attention on the fabrication processes so as to produce the memory device reflecting the precise adjustment for the two threshold voltages. Moreover, the charge-up circuit disclosed by Vernon G. McKenny needs the inverter circuit dedicated to the MOS field effect transistor 13, which increases the number of component transistors and results in complexity in circuit configuration.

DESCRIPTION OF THE PREFERRED EMBODIMENT

First Embodiment

Figure 3:
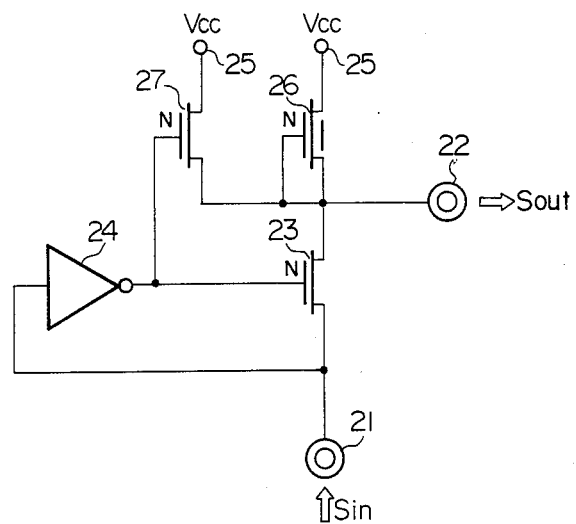
FIG. 3 is a circuit diagram showing the circuit arrangement of a first preferred embodiment according to the present invention.

Referring to FIG. 3 of the drawings, there is shown the circuit arrangement of a sense amplifier circuit embodying the present invention. The sense amplifier circuit shown in FIG. 3 is provided with a signal input node 21 and a signal output node 22. Though not shown in the drawings, the signal input node 21 is capable of being connected to one of many EPROM cells arranged in rows and columns. One of the EPROM cells is selected by row and column selectors (not shown) and supplies the input node 21 with an input signal Sin of either high or low voltage level depending upon a bit of information stored therein. Namely, when a selected EPROM cell stores a bit of information of "0", the input node 21 is grounded through the column selector and the selected EPROM cell, thereby causing the input node 21 to have the low voltage level. On the other hand, when a selected EPROM cell stores a bit of information of "1", the input node 21 is isolated from ground, then the input signal Sin of the high voltage level appears at the input node 21.

Between the signal input node 21 and the signal output node 22 is provided an n-channel enhancement-type MOS field effect transistor 23 which has a source node connected to the signal input node 21, a drain node connected to the signal output node 22 and a gate electrode. The signal input node 21 is further coupled to an input node of an inverter circuit 24, and the inverter circuit 24 is operative to produce the inverse of the input signal Sin applied to the signal input node 21. The inverter circuit 24 has an output node coupled to the gate electrode of the MOS field effect transistor 23 and supplies the gate of the MOS field effect transistor 23 with the inverse of the input signal swinging its voltage level between a high voltage level and a low voltage level. In this instance, the inverter circuit 24 is arranged to have a threshold voltage Vthi higher than the input signal Sin of the low voltage level, but lower than the input signal Sout of the high voltage level. Moreover, the MOS field effect transistor 23 is arranged to have a threshold voltage which the output signal of the inverter circuit 24 exceeds on the way from the low voltage level to the high voltage level.

Between a source of positive voltage 25 producing a positive voltage level Vcc and the signal output node 22 is provided an n channel depletion-type MOS field effect transistor 26 and an n channel enhancement-type MOS field effect transistor 27 which are arranged to be in parallel and are capable of supplying the signal output node 22 with currents, respectively. However, the MOS field effect transistor 26 has a gate electrode and a source node coupled to each other, so that the MOS field effect transistor 26 serves as a load transistor. On the other hand, the MOS field effect transistor 27 has a gate electrode coupled to the output node of the inverter circuit 24, then the MOS field effect transistor 27 is controlled by the inverter circuit 24 based on the voltage level at the signal input node 21 so as to serve as charge-up means. Namely, when the inverter circuit 24 produces the output signal of the high voltage level based on the input signal Sin of the low voltage level, the MOS field effect transistor 27 turns on and supplies the signal output node 22 with the current from the source of positive voltage 25, while the inverter circuit 24 produces the output signal of the low voltage level, then the MOS field effect transistor 27 turns off, blocking the current path from the source of positive voltage 25 to the signal output node 22. However, the threshold voltage Vthc of the MOS field effect transistor 27 is selected in such a manner that only a low conductivity channel with respect to the MOS field effect transistor 23 takes place even if the inverter circuit 24 produces the output signal of the high voltage level. Moreover, in this instance, the MOS field effect transistor 26 serving as the load transistor has a sufficiently large channel resistance with respect to not only the MOS field effect transistor 23 but also the MOS field effect transistor 27, and the MOS field effect transistors 26 and 27 arranged in parallel still provide a relatively large total resistance with respect to the MOS field effect transistor 23, so that the installation of the MOS field effect transistor 27 hardly affects the voltage level at the signal output node 22. Namely, when the input signal Sin of the low voltage level appears at the input node 21, a sufficiently low voltage level takes place at the signal output node 22.

In operation, when the EPROM cell selected by the row and column selectors stores the bit of information of "0", the signal input node 21 is grounded through the column selector and the selected EPROM cell, then the input signal Sin of the low voltage level appears at the signal input node 21. The voltage level of the input signal Sin is lower than the threshold voltage Vthi of the inverter circuit 24, so that the output signal of the high voltage level takes place at the output node of the inverter circuit 24. This results in that the MOS field effect transistor 23 turns on, thereby establishing a current path from the signal output node 22 through the MOS field effect transistor 23, the column selector and the selected EPROM cell to the ground. As described hereinbefore, the MOS field effect transistor 23 has a sufficiently large channel conductance, so that the signal output node 22 goes down toward the ground level and reaches the sufficiently low voltage level near the ground voltage level. The inverse of the input signal Sin is also applied to the gate electrode of the MOS field effect transistor 27 and causes the transistor 27 to turn on, however a small amount of current flows through the MOS field effect transistor 27 because the voltage value applied between the gate electrode and the drain node of the MOS field effect transistor 27 is smaller than that of the MOS field effect transistor 23 based on the respective locations in the amplifier circuit. Then, the current consumption does not deteriorate so much.

On the other hand, when the row and column selectors select an EPROM cell storing the bit of information of "1", the signal input node 21 is blocked from ground. This gives rise to an increase in voltage level at the signal input node 21. When the voltage level at the signal input node 21 exceeds the threshold voltage Vthi of the inverter circuit 24, the output node of the inverter circuit 24 goes down toward the low voltage level, which urges the MOS field effect transistor 23 to turn off, resulting in further increasing in voltage level at the signal output node 22. In the initial stage, the MOS field effect transistors 26 and 27 simultaneously provide current paths through which currents flow from the source of positive voltage 25 to the signal output node 22. This is conducive to reaching the high voltage level at an increased speed, resulting in improvement of the memory cycle time. Moreover, in the embodiment shown in FIG. 3, the inverter circuit 24 simultaneously supplies both of the MOS field effect transistors 23 and 27 with the inverse of the input signal, which is conducive to forming the sense amplifier circuit with a minimized number of transistors to achieve an increased operation speed. The MOS field effect transistors 23 and 27 are controlled by the common inverter circuit 24, so that it is unnecessary for a designer to precisely adjust the threshold voltages carried out in the sense amplifier circuit disclosed by Vernon G. McKenny.

Second embodiment

Figure 4:
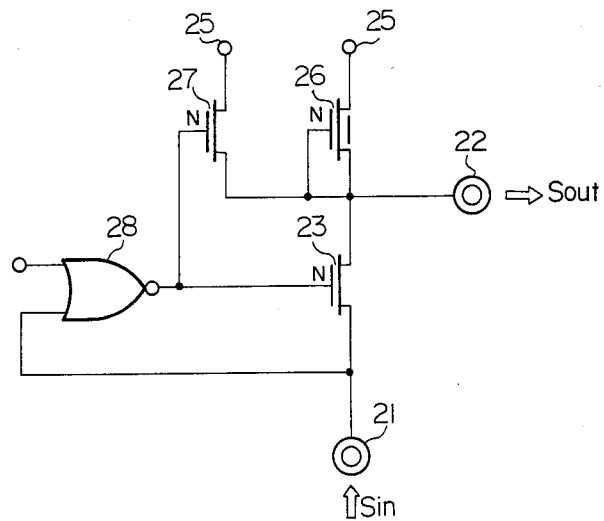
FIG. 4 is a circuit diagram showing the circuit arrangement of a second preferred embodiment according to the present invention.

Turning to FIG. 4 of the drawings, there is illustrated the circuit arrangement of another sense amplifier circuit embodying the present invention. The sense amplifier circuit illustrated in FIG. 4 has a two-input NOR gate 28 instead of the inverter circuit in the sense amplifier circuit illustrated in FIG. 4. The other circuit components are similar to those of the sense amplifier circuit illustrated in FIG. 3 and, for this reason, the other circuit components are denoted by the reference numerals designating the respective counterparts of the sense amplifier circuit illustrated in FIG. 3.

The two-input NOR gate 28 is arranged to have one input node connected to the signal input node 21 and the other input node supplied with an activating signal swinging its voltage level between high and low voltage levels. The NOR gate 28 thus arranged produces an output signal of a high voltage level only when both of the input nodes has the respective low voltage levels, and the output signal thereof are supplied to the respective gate electrodes of the MOS field effect transistors 23 and 27.

In operation, when the activating signal remains in the high voltage level, the NOR gate 28 is inactivated and causes the output signal thereof to be in floating state. However, when the activating signal has the low voltage level, the NOR gate 28 produces the output signal of either high or low voltage level depending upon the voltage level at the signal input node 21. Thus, the sense amplifier circuit illustrated in FIG. 4 is shifted between the active state and inactive state depending upon the voltage level of the activating signal. For this reason, even if a system has a CPU associated with a plurality of EPROM devices connected by a shared bus, the CPU can access an address of a selected EPROM device by using the activating signal such as, for example, a chip enable signal.

- However, in the presence of the activating signal of the low voltage level, the NOR gate 28 produces the output signal of either high or low voltage level depending upon the voltage level of the input signal Sin appearing at the signal input node 21. Namely, when the input signal Sin of the low voltage level appears at the signal input node 21, the output signal of the high voltage level takes place at the output node of the NOR gate 28, then the MOS field effect transistors 23 and 27 are turned on, providing the respective current paths. Then, the signal output node 22 is conducted through the MOS field effect transistor 23 to the signal input node 21. This results in decreasing in voltage level at the signal output node 22. As similar to the sense amplifier illustrated in FIG. 3, the MOS field effect transistor 27 merely provides a low conductivity channel, so that the current supplied through the MOS field effect transistor 27 does not substantially affect the voltage level at the signal output node 22.

On the other hand, if the input signal Sin goes up toward the high voltage level, the NOR gate 28 changes the output signal from the high voltage level to the low voltage level. This causes the MOS field effect transistors 23 and 27 to turn off, pulling up the voltage level at the signal output node 22, however, in the initial stage thereof, the signal output node 22 is supplied with the currents through not only the MOS field effect transistor 26 but also the MOS field effect transistor 27. Then, the signal output node 22 rapidly rises and reaches the high voltage level. As a result, the sense amplifier operates at an increased speed and is conductive to improvement of the memory cycle time.

Third Embodiment

Figure 5:
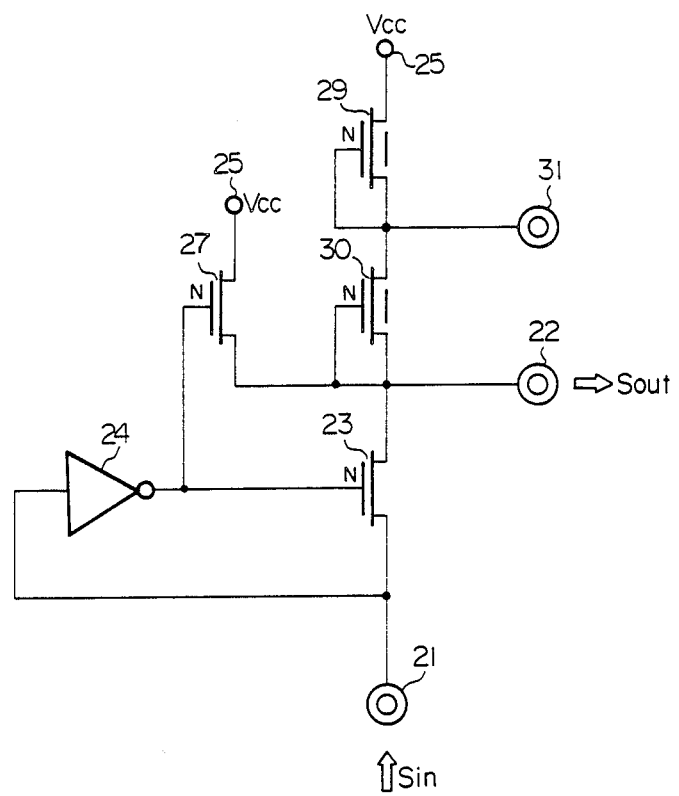
FIG. 5 is a circuit diagram showing the circuit arrangement of a third preferred embodiment according to the present invention.

Referring to FIG. 5 of the drawings, there is shown the circuit arrangement of still another sense amplifier circuit embodying the present invention. In FIG. 5, a series combination of n-channel depletion-type MOS field effect transistors 29 and 30 are employed instead of the MOS field effect transistor 26 of the sense amplifier circuit illustrated in FIG. 3. The other circuit components are similar to those of the sense amplifier circuit illustrated in FIG. 3, so that the other circuit components are denoted by the reference numerals designating the counterparts in the sense amplifier circuit illustrated in FIG. 3.

The series combination of the MOS field effect transistors 29 and 30 are provided between the source of positive voltage 25 and the signal output node 22 and has an intermediate node connected to a second output node 31. The MOS field effect transistor 29 has a gate electrode and a source node connected to each other, and the MOS field effect transistor 30 also has a gate electrode and a source node connected to each other, then both of the MOS field effect transistors 29 and 30 serve as load transistors. The sense amplifier circuit thus arranged is operative to produce an output signal Sout of either high or low voltage level at the signal output node 22 depending upon the voltage level of the input signal Sin appearing at the signal input node 21 as similar to the sense amplifier circuit illustrated in FIG. 3.

In addition to the production of the output signal Sout swinging between the high and low voltage levels, the sense amplifier circuit illustrated in FIG. 5 finds another practical application for its second output node 31. Namely, if the sense amplifier circuit illustrated in FIG. 5 is connected to a dummy EPROM cell (not shown) causing the signal input node 21 to have the low voltage level, a constant medium voltage level between the high and low voltage levels at the signal output node 22 appears at the second output node 31. With the medium voltage level at the output node 31, a second stage sense amplifier can rapidly determine the voltage level of the output signal of a first stage sense amplifier associated with a group of EPROM cells each storing the piece of information. Thus, the constant medium voltage level is useful in a semiconductor memory device such as an EPROM device, and the constant medium voltage level can be easily obtained by using one of the sense amplifier according to the present invention with a connection to the dummy cell.

Fourth Embodiment

Figure 6:
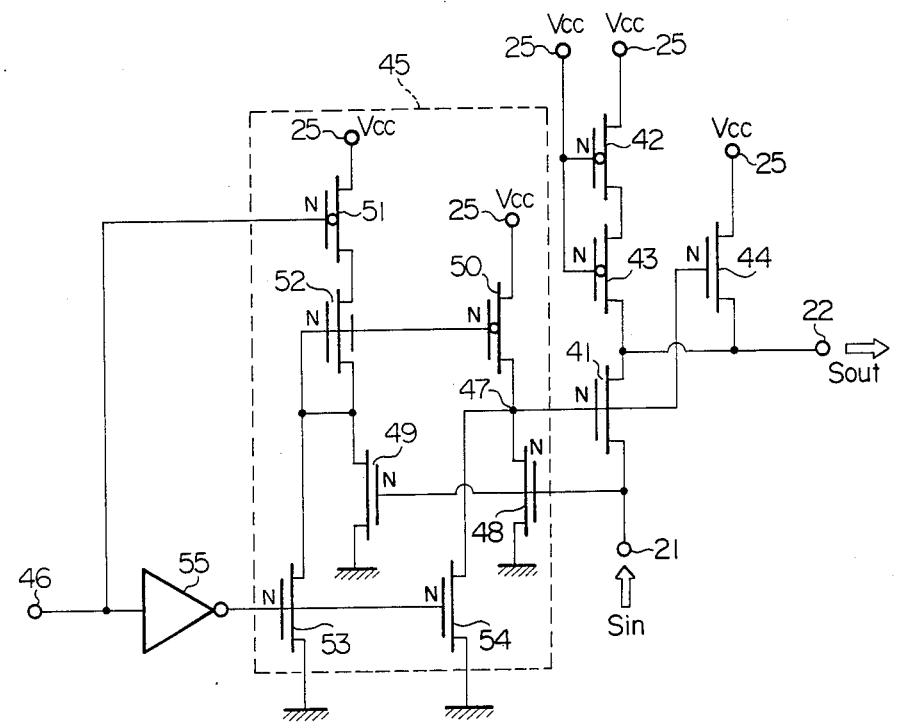
FIG. 6 is a circuit diagram showing the circuit arrangement of a fourth preferred embodiment according to the present invention.

Referring to FIG. 6 of the drawings, the circuit arrangement of still another sense amplifier circuit is illustrated. The sense amplifier circuit illustrated in FIG. 6 is also provided with the signal input node 21 and the signal output node 22. The sense amplifier circuit comprises a series combination of an n-channel depletion-type MOS field effect transistor 41 and two n-channel shallow depletion-type MOS field effect transistors 42 and 43 provided between the source of positive voltage 25 producing a positive voltage level of about 5.0 volts and the signal input node 21. Each of the MOS field effect transistors 42 and 43 has a gate electrode connected to the source of positive voltage 25 for being capable of providing a current path between the source of positive voltage 25 and the signal output node 22. Between the source of positive voltage 25 and the signal output node 22 is further provided an n-channel depletion-type MOS field effect transistor 44 serving as charge-up means. Thus, the sense amplifier circuit illustrated in FIG. 6 has two current paths so as to charge-up the signal output node 22, however the series combination of the shallow depletion-type MOS field effect transistors 42 and 43 provide a relatively large resistance with respect to the charge-up transistor 44, then the signal output node 22 is mainly supplied with current through the charge-up transistor 44.

The sense amplifier circuit illustrated in FIG. 6 further comprises a NOR gate 45 having two input nodes one of which is connected to the signal input node 21 and the other of which is connected through an inverter circuit 55 to a control node 46 supplied with an activating signal swinging its voltage level between high and low voltage levels. Then, the logic gate 45 carries out the NOR operation for combination of the inverse of the activating signal and the input signal Sin appearing at the signal input node 21 and produces at an output node 47 an output signal which is applied to both of the gate electrodes of the MOS field effect transistors 41 and 44. The NOR gate 45 has n-channel enhancement-type MOS field effect transistors 48 and 49 each having a gate electrode connected to the signal input node 21. The two MOS field effect transistors 48 and 49 thus arranged are concurrently shifted between on and off states depending upon the voltage level at the signal input node 21. The MOS field effect transistor 48 is provided in association with an n-channel shallow depletion-type MOS field effect transistor 50 to form in combination a series network between the source of positive voltage 25 and ground. The MOS field effect transistor 49 is also provided in association with an n-channel shallow depletion-type MOS field effect transistor 51 and an n-channel depletion-type MOS field effect transistor 52 to form in combination another series network between the source of positive voltage 25 and the ground. The MOS field effect transistor 51 has a gate electrode connected to the control node 46 where the activating signal applied. The NOR gate 45 further has two n-channel enhancement-type MOS field effect transistors 53 and 54 each having a gate electrode connected to the control node 46 through the inverter circuit 55. Then, the two MOS field effect transistors 53 and 54 are shifted between on and off states depending upon the inverse of the activating signal. The MOS field effect transistor 54 has a drain node connected to the output node 47 of the NOR gate 45 which in turn is connected to the respective gate electrodes of the MOS field effect transistors 41 and 44. The MOS field effect transistor 53 has a drain node connected to respective gate electrodes of the MOS field effect transistors 52 and 50 and a drain node of the MOS field effect transistor 49. In this instance, each of the n- channel enhancement-type MOS field effect transistors 41, 44, 48, 49, 53 and 54 has a threshold voltage of about +0.7 volt, and the n-channel depletion-type MOS field effect transistor 52 has a threshold voltage of about -3.0 volts. On the other hand, each of the n-channel shallow depletion-type MOS field effect transistors 42, 43, 50 and 51 has a threshold voltage of about −0.3 volt.

In operation, when the activating signal remain in the low level, the inverter 55 supplies the respective gate electrodes of the MOS field effect transistors 53 and 54 with the output signal of the positive high voltage level higher than the threshold voltage of the n-channel enhancement-type MOS field effect transistor, then the MOS field effect transistor 54 turns on, causing the output node 47 of the NOR gate 45 to conduct to ground. The MOS field effect transistor 53 also turns on to cause the MOS field effect transistors 52 and 50 to turn off. With the activating signal of the low voltage level, the MOS field effect transistor 51 turns off. Then, all the current paths from the source of positive voltage 25 are blocked, so that the input signal Sin appearing at the signal input node 21 have no effect on the NOR operation. In other words, the sense amplifier circuit is put into the high-impedance state.

On the other hand, when the activating signal goes up to the high voltage level, the inverter circuit 55 produces the output signal of the low level which causes the MOS field effect transistors 53 and 54 to turn off. With the activating signal of the high voltage level, the MOS field effect transistor 51 turns on, and the MOS field effect transistor 52 in turn is shifted to the on state, providing a current path from the source of positive voltage source 25 to the drain node of the MOS field effect transistor 49. In this situation, the sense amplifier circuit is now put into the active state. Then, if the input signal Sin of the high voltage level appears at the signal input node 21, the MOS field effect transistors 48 and 49 turn on. When the MOS field effect transistor 49 is turned on, the voltage level at each of the gate electrodes of the MOS field effect transistors 52 and 50 goes down toward the ground level, causing both of the MOS field effect transistors 52 and 50 to turn off. As the MOS field effect transistor 48 is turned on, the output node 47 is discharged without supplement of current from the source of positive voltage 25, then going down toward the ground level. With the low voltage level at the output node 47, the MOS field effect transistors 41 and 44 turns off to produce the output signal Sout of the high voltage level. However, in the initial stage of rise in voltage level, the MOS field effect transistor 44 remains in the on state, so that the output node 22 is rapidly charged up.

On the other hand, when the input signal Sin has the low voltage level, the MOS field effect transistor 48 is turned off to isolate the output node 47 from the ground. With the input signal Sin of the low voltage level, the MOS field effect transistor 49 also turns off. As the MOS field effect transistor 53 is turned off in the presence of the inverse of the activating signal of the high voltage level, the gate electrode of the MOS field effect transistor 50 goes up to the positive high level, causing the MOS field effect transistor 50 to turn on to supply the output node 47 with current from the source of positive voltage 25. This results in the ouput signal of the high voltage level which is applied to the respective gate electrodes of the MOS field effect transistors 41 and 44. With the high voltage level applied to the respective gate electrodes of the MOS field effect transistors 41 and 44, the MOS field effect transistors 41 and 44 turn on. However, the MOS field effect transistor 44 has a low-conductivity channel with respect to the MOS field effect transistor 41, so that the output node 22 rapidly goes down to the low voltage level.

Figure 7:
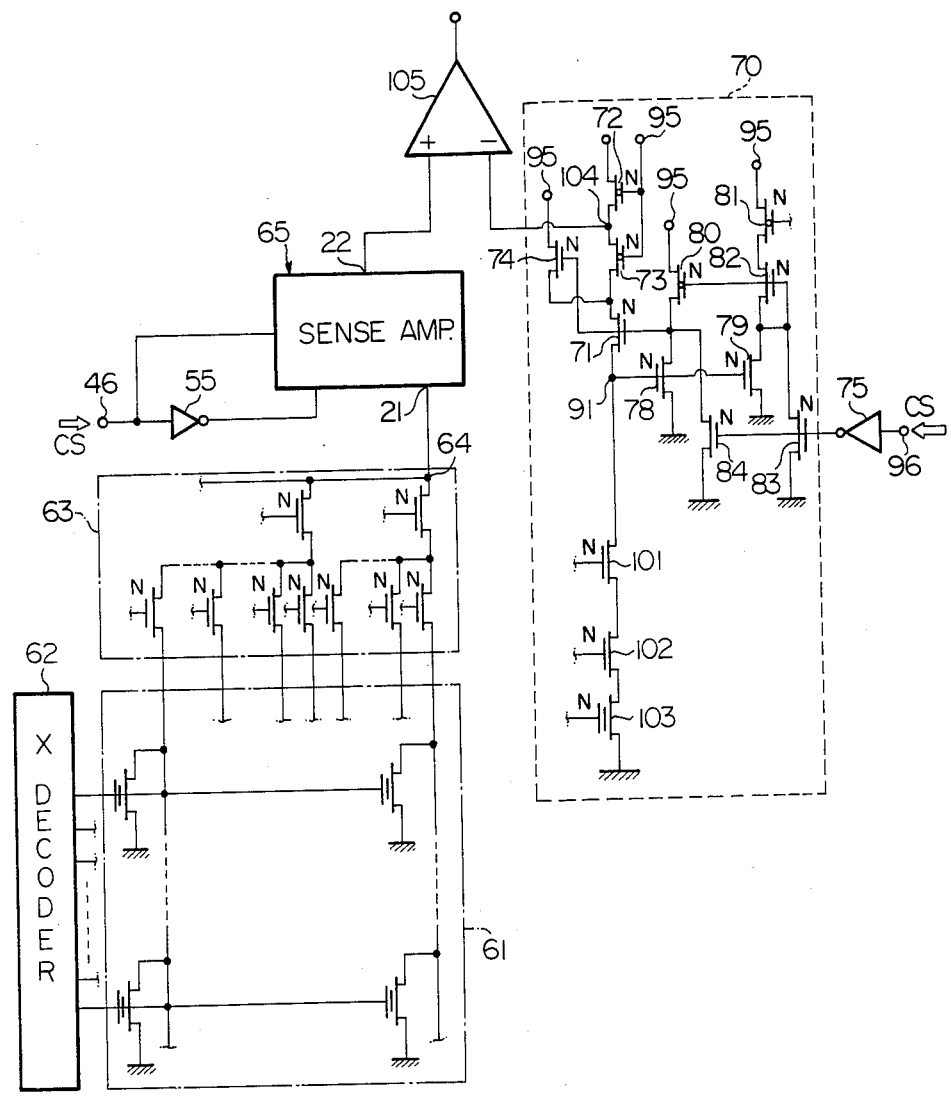
FIG. 7 is a circuit diagram showing the circuit arrangement of a semiconductor memory device in which the sense amplifier illustrated in FIG. 6 is incorporated.

Turning to FIG. 7 of the drawings, there is shown the circuit arrangement of an EPROM device provided with a plurality of sense amplifier circuits each basically having the similar construction to the sense amplifier circuit illustrated in FIG. 6. All the components shown in FIG. 7 are fabricated on a single semiconductor substrate (not shown). In FIG. 7, reference numeral 61 denotes a memory cell array comprising a plurality of EPROM cells arranged in rows and columns, a plurality of word lines each commonly connected to the respective control gates of the EPROM cells arranged in the corresponding row, and a plurality of bit lines each commonly connected to the respective drain nodes of the EPROM cells arranged in the corresponding column. The source node of each EPROM is grounded. The word lines are connected to an X decoder 62 to which a set of address signals are applied to select a single word line. In the similar manner, all the bit lines are connected to a Y selector 63 for transferring the voltage level on the selected digit line to the output node 64. The output node 64 of the Y selector is coupled to a signal input node 21 of a sense amplifier circuit 65, so that the voltage level transferred to the output node 64 is applied to the signal input node 21 as the input signal Sin. The sense amplifier circuit 65 is similar in construction to the sense amplifier circuit illustrated in FIG. 6, so that the components of the sense amplifier circuit illustrated in FIG. 7 are denoted by like reference numerals designating the counter parts of the sense amplifier circuit illustrated in FIG. 6. The inverter circuit 55 is supplied with a chip enable signal CS applied from an external device, and the chip enable signal CS has a high voltage level for activation of the selected chip, but a low voltage level so as to keep the chip in inactivated state.

The memory device illustrated in FIG. 7 further comprises a reference voltage producing circuit 70 in which MOS field effect transistors 71, 72, 73, 74, 78, 79, 80, 81, 82, 83 and 84, an inverter circuit 75 and nodes 91, 95 and 96 correspond to the MOS field effect transistors 41, 42, 43, 44, 48, 49, 50, 51, 52, 53 and 54, the inverter circuit 55 and the nodes 21, 25 and 46 illustrated in FIG. 6, respectively. The reference voltage producing circuit 70 further comprises a series combination of two n-channel enhancement-type MOS field effect transistors 101 and 102 and a dummy EPROM cell 103. The two MOS field effect transistors 101 and 102 are always turned on with the signals of the high voltage level which are applied to the Y selector 63 for selecting one of the digit lines and form a dummy Y selector which provides a resistance approximately equal to that of the Y selector 63. Similarly, the dummy EPROM cell 103 has the same structure as the EPROM cell storing the bit of information of "0" and is supplied from the X decoder 62 with a high voltage level signal which corresponds to the signal applied to the selected word line so as to provide a resistance approximately equal to that of the EPROM cell storing the bit of the information of "0". The serial combination of the two MOS field effect transistors 101 and 102 and the dummy EPROM cell 103 thus arranged provides a total resistance approximately equal to that of the Y selector 63 and the EPROM cell storing the bit of information of "0" in the memory cell array 61, so that the signal input node 91 is supplied with a low voltage level approximately equal to that appearing at the signal input node 66. The reference voltage producing circuit 70 has an output node 104 instead of a signal output node corresponding to the node 22 of the sense amplifier circuit illustrated in FIG. 6. The output node 104 is located between the MOS field effect transistors 72 and 73, so that a medium voltage level between the high and low voltage levels of the output signal Sout appears at the output node 104 when the chip enable signal is applied to the node 96. The output node 104 and the signal output node 22 are connected to two input nodes of a comparator so as to rapidly determine the read-out information stored in the accessed EPROM cell.

Description will be hereinunder made for the operation of the memory device with reference to not only FIG. 7 but also FIG. 6 of the drawings. Assuming now that the signal input node 21 has the low voltage level at a beginning of memory cycle, when the chip enable signal CS goes high and the Y selector allows one of the digit lines to electrically connect with the signal input node 21, the inverter circuit 45 produces the output signal of the high voltage level, thereby causing the MOS field effect transistors 41 and 44 to turn on for charging up the selected digit line. In this charging-up stage, the current mainly flows through the MOS field transistor 44 but hardly flows through the series of MOS field effect transistors 42 and 43 because of the difference in resistance therebetween. The selected bit line is thus charged up through the low-resistance MOS field effect transistor 44, then the signal input node 21 rapidly goes up over the threshold voltage of the inverter 45 circuit. With the high voltage level at the signal input node 21, the inverter 45 changes its output signal from the high voltage level toward the low voltage level, so that the MOS field effect transistor 44 first tends to turns off. This is because of the fact that the drain node of the MOS field effect transistor 44 is higher in voltage level than the signal input node 21 at all times. After completion of charging-up, the X decoder 62 allows one of the word lines to go up high so as to specify an EPROM cell from which a piece of information be read out.

If the specified EPROM cell stores the bit of information of "1", or is an "off bit", the EPROM cell does not provide any current path from the selected digit line to the ground, then the signal input node 21 remains high and causes the MOS field effect transistor 41 to turn off when the output signal of the inverter circuit 45 goes down below the threshold voltage of the transistor 41. When the MOS field effect transistors 41 and 44 are completely turned off, the signal output node 22 is continuously supplied with current through the high resistance series combination of MOS field effect transistors 42 and 43, thereby pulling up the signal output node 22 to the approximately Vcc level. Then, the output signal Sout of the high voltage level appears at the signal output node 22. At this time, the medium voltage level takes place at the output node 104 of the reference voltage producing circuit 70, so that the output signal Sout is compared with the medium voltage level by the comparator 105 to rapidly decide whether the accessed EPROM cell stores the bit of information of "0" or "1".

On the other hand, when the specified EPROM cell stores the bit of information of "0", or is an "on bit", the EPROM cell provides a current path from the selected bit line to the ground, then the signal input node 21 goes down to the low voltage level and causes the MOS field effect transistor 41 to be turned on. Although a small amount of current flows through the high resistance series combination of MOS field effect transistors 42 and 43, the output signal Sout of the low voltage level of about 1.2 volts appears at the signal output node 22 because of the low resistance along the current path from the signal output node 22 to the ground. At this stage, if some disturbances take place and, then, the voltage level at the signal output node 22 goes up, the MOS field effect transistor 44 turns on to compensate for the voltage drop. Thus the MOS field effect transistor 44 is conducive to keeping the output signal Sout in the stable state. At this time, the medium voltage level takes place at the output node 104 of the reference voltage producing circuit 70, so that the output signal Sout is compared with the medium voltage level by the comparator 105 to rapidly decide whether the accessed EPROM cell stores the bit of information of "0" or "1".

As will be understood from the foregoing description, the sense amplifier circuit according to the present invention is advantageous over the prior art sense amplifier circuits illustrated in FIGS. 1 and 2 in that the sense amplifier circuit according to the present invention is composed of a minimized number of transistors to achieve an increased operation speed and is free from the design constraint encountered in the sense amplifier circuit disclosed by Vernon G. McKenny.

Each of the sense amplifier circuits embodying the present invention is provided with a plurality of n-channel MOS field effect transistors, however it is possible to construct a sense amplifier circuit according to the present invention with p-channel MOS field effect transistors. Moreover, it will be obvious to those skilled in the art that various changes and modifications may be made without departing from the spirit and scope of the present invention.

Additionally, the sense amplifier circuits illustrated in FIGS. 3 to 6 are provided in association with a EPROM cell array, however each of the sense amplifier circuits according to the present invention is applicable to any electric circuit.

What is claimed is:

1. A sense amplifier circuit comprising
    (a) a signal input node;
    (b) a signal output node;
    (c) load means with a relatively large resistance coupled between a source of voltage and said signal output node;
    (d) a first field effect transistor with a relatively small channel resistance coupled between said signal input node and said signal output node and having a gate electrode;

(e) a logic gate having at least one input node connected to said signal input node and an output node connected to the gate electrode of the first field effect transistor; and (f) a second field effect transistor with a relatively small channel resistance with respect to said first field effect transistor, said second field effect transistor being coupled between said source of voltage and said signal output node and having a gate electrode connected to the output node of said logic gate, in which said load means comprise an n-channel depletion-type field effect transistor having a source node, a gate electrode and a drain node connected to said source of voltage producing a positive voltage level, said source node and said gate electrode being connected to said signal output node and in which said first and second field effect transistors are of an n-channel enhancement type, wherein said logic gate has two input nodes, one of said two input nodes being connected to said signal input node, and performs a NOR operation in the presence of an activating signal applied to the other of said two input nodes.

2. A sense amplifier circuit as set forth in claim 1, in which said first field effect transistor has a threshold voltage approximately equal to that of said second field effect transistor.

3. A sense amplifier circuit for use in a semiconductor memory device including a memory cell array having a plurality of memory cells arranged in rows and columns, a row selector selecting a row of memory cells, a column selector selecting a column of memory cells and having an output node to which a high voltage level or a low voltage level appears depending upon a piece of information stored in one of said memory cells specified by both of the row and column selectors, a reference voltage producing circuit and a comparator having two input nodes one of which is connected to the reference voltage producing circuit, comprising (a) a signal input node connected to the output node of said column selector;

(b) a signal output node connected to the other of the input nodes of said comparator;

(c) a series combination of n-channel shallow depletion-type field effect transistors coupled between a source of positive voltage and said signal output node, said n-channel shallow depletion-type field effect transistors having respective gate electrodes connected to said source of positive voltage so as to provide a relatively large resistance;

(d) a first n-channel enhancement-type field effect transistor with a relatively small channel resistance coupled between said signal output node and said signal input node and having a gate electrode;

(e) a second n-channel enhancement-type field effect transistor with a relatively small channel resistance coupled between said positive voltage source and said signal output node and having a gate electrode, said second n-channel enhancement-type field effect transistor having a threshold voltage approximately equal to that of said first n-channel enhancement-type field effect; and (f) a NOR gate having an output node connected to both of the gate electrodes of said first and second n-channel enhancement-type field effect transistors and two input nodes one of which is connected to said signal input node and the other of which is capable of being supplied with an activating signal.

4. A sense amplifier circuit as set forth in claim 3, in which said reference voltage producing circuit comprises a signal input node connected to a constant voltage source producing the low voltage level approximately equal to that appearing at the output node of said column selector when the specified memory cell stores a piece of information of logic "0" level, a coupling node, a series combination of n-channel shallow depletion-type field effect transistors coupled between said source of positive voltage and said coupling node, said n-channel shallow depletion-type field effect transistors having respective gate electrodes connected to said source of positive voltage so as to provide a relatively large resistance, an intermediate node provided between said n-channel shallow depletion-type field effect transistors and connected to one of the input nodes of said comparator, a first n-channel enhancement-type field effect transistor with a relatively small channel resistance coupled between said coupling node and said signal input node and having a gate electrode, a second n-channel enhancement-type field effect transistor with a relatively small channel resistance coupled between said positive voltage source and said coupling node and having a gate electrode, said second n-channel enhancement-type field effect transistor having a threshold voltage approximately equal to that of said first n-channel enhancement-type field effect transistor, and a NOR gate having an output node connected to both of the gate electrodes of said first and second n-channel enhancement-type field effect transistors and two input nodes one of which is connected to said signal input node and the other of which is capable of being supplied with said activating signal.

5. A sense amplifier circuit comprising (a) a signal input node;

(b) a signal output node;

(c) load means with a relatively large resistance coupled between a source of voltage and said signal output node;

(d) a first field effect transistor with a relatively small channel resistance coupled between said signal input node and said signal output node and having a gate electrode;

(e) a logic gate having at least one input node connected to said signal input node and an output node connected to the gate electrode of the first field effect transistor; and (f) a second field effect transistor with a relatively small channel resistance with respect to said first field effect transistor, said second field effect transistor being coupled between said source of voltage and said signal output node and having a gate electrode connected to the output node of said logic gate, in which said load means comprise a series combination of a first n-channel depletion-type field effect transistor, an intermediate node and a second n-channel depletion-type field effect transistor coupled between said source of voltage producing a positive voltage level and said signal output node for providing a current path therebetween, said first and second n-channel depletion-type field effect transistors having respective gate electrodes connected to said intermediate node and said signal output node, respectively, wherein said first and second field effect transistors are of an n-channel enhancement-type and said logic gate performs a NOT operation.

6. A sense amplifier circuit comprising
(a) a signal input node;
(b) a signal output node;
(c) load means with a relatively large resistance coupled between a source of voltage and said signal output node;
(d) a first field effect transistor with a relatively small channel resistance coupled between said signal input node and said signal output node and having a gate electrode;
(e) a logic gate having at least one input node connected to said signal input node and an output node connected to the gate electrode of the first field effect transistor; and
(f) a second field effect transistor with a relatively small channel resistance with respect to said first field effect transistor, said second field effect transistor being coupled between said source of voltage and said signal output node and having a gate electrode connected to the output node of said logic gate, in which said load means comprise a series combination of a first n-channel shallow depletion-type field effect transistor, an intermediate node and a second n-channel shallow depletion-type field effect transistor coupled between said source of voltage producing a positive voltage level and said signal output node for providing a current path therebetween, said first and second n-channel shallow depletion-type field effect transistors having respective gate electrodes connected to said source of voltage, wherein said first and second field effect transistors are of an n-channel enhancement-type, and said logic gate has two input nodes, one of said two input nodes being connected to said signal input node, and performs a NOR operation in the presence of an activating signal applied to the other of two input nodes for activation of the logic gate.

7. A sense amplifier circuit as set forth in claim 6, in which said sense amplifier circuit further comprises a medium voltage output node connected to said intermediate node.

* * * * *